US006384636B1

United States Patent
Koo

(10) Patent No.: US 6,384,636 B1
(45) Date of Patent: May 7, 2002

(54) FAST AND PRECISE CURRENT-SENSE CIRCUIT FOR HIGH-VOLTAGE SWITCH

(75) Inventor: Ronald B. Koo, Mountain View, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/713,363

(22) Filed: Nov. 14, 2000

(51) Int. Cl.$^7$ .............................. H03D 1/00; H03K 5/22; H03K 5/153; H03K 5/159

(52) U.S. Cl. .......................... 327/51; 327/427; 327/543; 323/316

(58) Field of Search .......................... 327/77, 103, 538, 327/543, 427, 50, 51, 53, 56; 323/312, 315, 316

(56) References Cited

U.S. PATENT DOCUMENTS

| | | | |
|---|---|---|---|
| 4,553,084 A | * 11/1985 | Wrathall | 323/316 |
| 4,820,968 A | * 4/1989 | Wrathall | 323/312 |
| 5,008,586 A | * 4/1991 | Miyazaki et al. | 323/315 |
| 5,079,456 A | * 1/1992 | Kotowshi et al. | 327/538 |
| 5,113,089 A | * 5/1992 | Osawa | 327/77 |
| 5,488,324 A | * 1/1996 | Mizuta et al. | 327/77 |
| 5,635,823 A | * 6/1997 | Murakami et al. | 323/315 |
| 5,646,520 A | * 7/1997 | Frank et al. | 324/158.1 |
| 5,650,737 A | * 7/1997 | Eilley | 327/427 |
| 5,670,867 A | * 9/1997 | Mitsuda | 323/312 |
| 5,796,278 A | * 8/1998 | Osborn et al. | 327/427 |
| 5,867,014 A | * 2/1999 | Wrathall et al. | 323/316 |
| 5,917,319 A | * 6/1999 | Frank et al. | 324/158.1 |
| 6,166,530 A | * 12/2000 | D'Angelo | 323/315 |

* cited by examiner

Primary Examiner—Toan Tran
Assistant Examiner—Long Nguyen
(74) Attorney, Agent, or Firm—Blakely, Sokoloff, Taylor & Zafman LLP

(57) ABSTRACT

A current-sense circuit provides a fast and precise measure of current through a switch with the sensing circuit being protected from a high-voltage across the switch and from large transient currents through the switch when the switch is first closed. The sensed load current is connected through a first conductive path including the current switch and through a second conductive path for passing a scaled portion of the current and a scaled bias current. An output circuit is responsive to a generated voltage in the second conductive path and the bias current for producing a measure of the sensed current. The second conductive path includes a voltage divider with the generated voltage taken at the common node. The output circuit includes a third field effect transistor with the generated voltage applied across the third field effect transistor and with the second and third field effect transistors having the same gate voltage applied thereto for equal currents through the transistors. The output circuit further includes two transistors including a first transistor for applying a current through the third field effect transistor and a second transistor providing an equal current as a first output of the current-sense circuit which is a sum of the bias current and a scaled version of the sensed current. A current source provides a scaled bias current as a second output, and a differential amplifier can be used for subtracting a value of the second output from a value of the first output and providing a measure of the sensed current.

23 Claims, 4 Drawing Sheets

FAST AND PRECISE CURRENT-SENSE CIRCUIT FOR HIGH-VOLTAGE SWITCH

BACKGROUND OF THE INVENTION

This invention relates generally to current-sense circuitry, and more particularly the invention relates to circuitry for sensing current through a high-voltage/high current switch.

Current-sensing is important for circuits operating at high-voltage or which have high currents to prevent overloading of the circuit. One such circuit is a switching DC-to-DC converter which uses current mode control. A decision to turn off the power switch can depend on the level of current flowing through the switch.

A circuit in accordance with the present invention allows fast and precise sensing of a current, even if a high-voltage is present when the switch is off or a spurious high current is present upon conduction of the switch.

SUMMARY OF THE INVENTION

Briefly, a circuit for sensing a load current comprises a first conductive path (e.g. switch) for passing a first portion of the current, a second conductive path for passing a second portion of a current and a scaled bias current, and an output circuit responsive to a generated voltage in the second conductive path and the bias current for producing a measure of the sensed current.

In a preferred embodiment the first conductive path comprises a load current switch and the second conductive path comprises a voltage divider including two serially connected field effect transistors having a common node. The output circuit includes a third field effect transistor with the generated voltage at the common node applied across the third field effect transistor. The second field effect transistor and the third field effect transistor have the same gate voltage applied thereto, thus the current through the two transistors are equal. Two transistors are provided in the output circuit including a first transistor for applying a current through the third field effect transistor and the second transistor providing an equal current as a first output. The current in the first transistor is a sample of the bias current and a scaled value of the sensed current. A current source can be provided for providing a scaled bias current as a second output, and means such as a differential amplifier receives a voltage derived from the first and second outputs and provides a measure of the sensed load current.

The invention and objects and features thereof will be more readily apparent from the following detailed description and appended claims when taken with the drawing.

DETAILED DESCRIPTION OF ILLUSTRATED EMBODIMENTS

Figure 1:
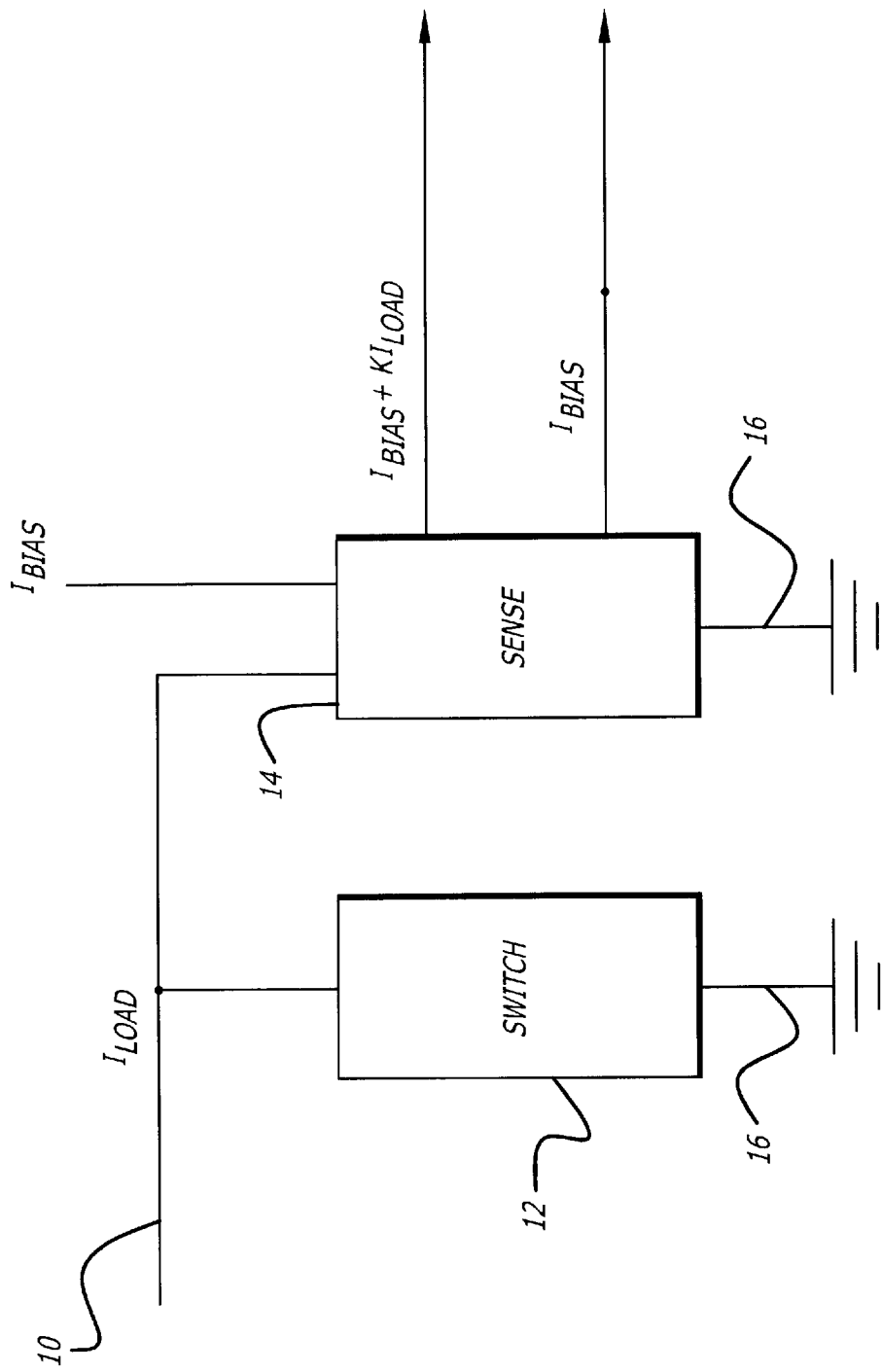
FIG. 1 is a functional block diagram of a current sense circuit in accordance with the invention.

FIG. 1 is a functional block diagram of a current-sense circuit in accordance with the invention. A load current is applied on line 10 upon closure of the load switch 12. Such a switch can be in a DC-to-DC converter, for example. A portion of the load current is passed through a sense circuit 14 which also receives a bias current, $I_{BIAS}$, and produces two outputs including an $I_{BIAS}$ current and an $I_{BIAS}+K\times I_{LOAD}$ current as shown. The coefficient K provides a scaled value of the load current in accordance with device parameters as will be described hereinbelow. Sense circuitry 14 provides a fast and precise sensing of the load current yet is protected from high voltage which may appear across switch 12 when the switch is off and also can be protected from spurious currents immediately after closing switch 12.

Figure 2:
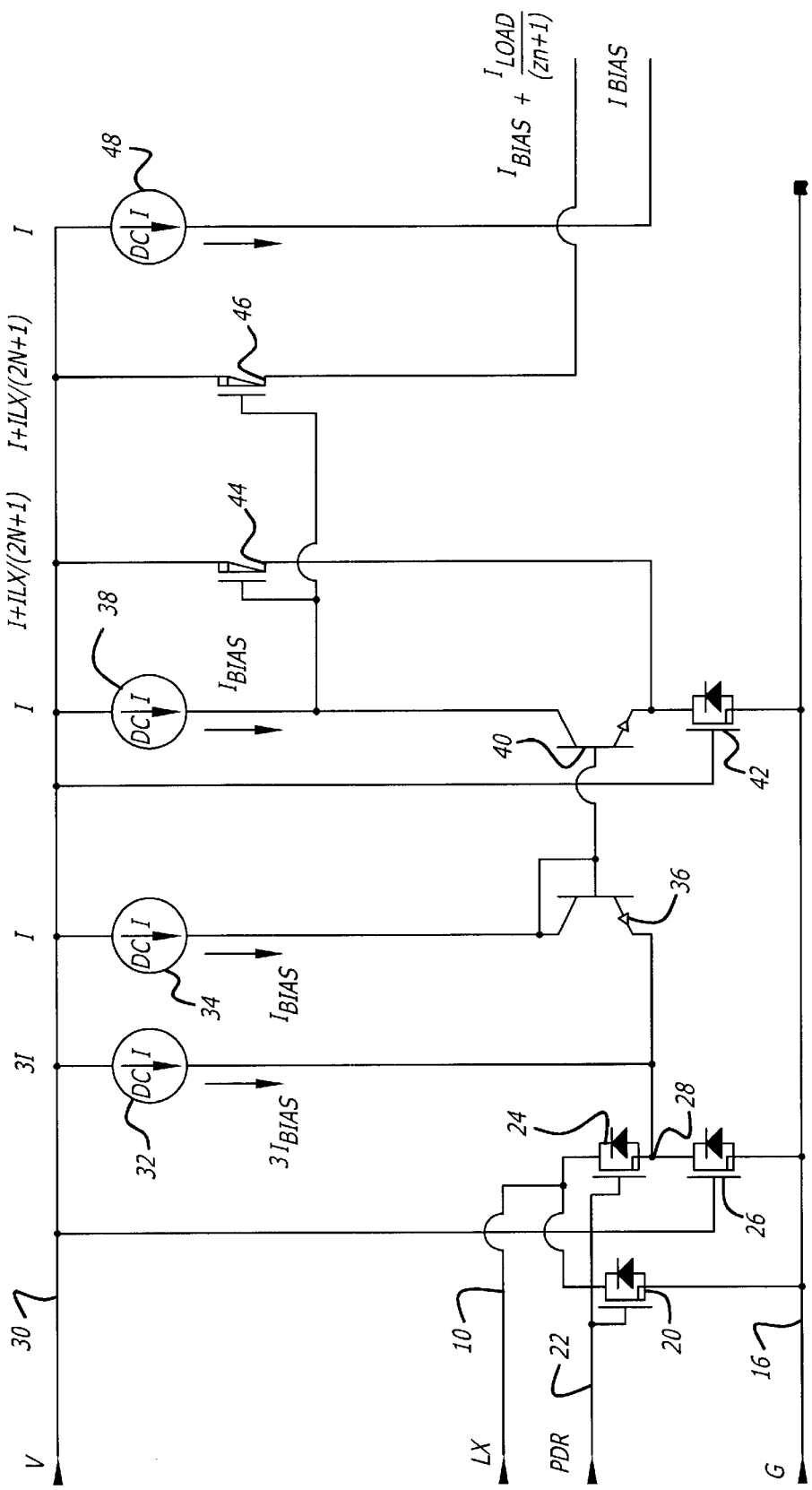
FIG. 2 is a schematic of one embodiment of the current sense circuit of FIG. 1 in accordance with the invention.

FIG. 2 is a schematic of one embodiment of the switch and sense circuitry in accordance with the invention. In this embodiment the switch comprises a field effect transistor 20 connected between load line 10 and circuit ground 16 with conduction of FET 20 controlled by a PDR signal on line 22. The sense circuitry includes two serially connected field effect transistors 24, 26 which are connected between load line 10 and ground 16 and have a common node 28. Conduction of transistor 24 is controlled by PDR line 22, and conduction of transistor 26 is controlled by a voltage, V, on line 30. When transistors 20 and 24 are conducting, PDR is approximately equal to voltage V on line 30.

A first current source 32 is connected to node 28 along with a second current source 34 which is connected through bipolar transistor 36 to node 28. A third current source 38 is connected through bipolar transistor 40 and field effect transistor 42 to circuit ground. The gate of transistor 42 is connected to voltage line 30, and the bias on the base of transistor 40 is taken at common terminal 28 through bipolar transistor 36. Transistor 44 connected between voltage line 30 and the common node of transistors 40, 42 provides current through transistor 42 to ground along with current from current source 38. Transistor 46 is identical to transistor 44 and both transistors are connected to the voltage line 30 and have a gate connection to current source 38. Transistor 46 and current source 48 provide two outputs from the sense-circuitry including a bias current ($I_{BIAS}$) and the bias current ($I_{BIAS}$) added to a scaled value of the switched load current. Thus, as will be described, by subtracting voltages derived from the two outputs, a value of the scaled load current is obtained.

When the PDR control signal on line 22 turns switch 20 on, transistors 20, 24, 26 and 42 can be simplified to resistors as long as they are operating deep in the triode region. Transistors 24, 26 and 42 can be approximated as equal resistors. The resistance of transistor 20 will usually be scaled down by a factor N compared to the resistance of transistor 24. Node 28 is half the voltage on the load line 10 since transistors 24 and 26 are approximately equal. The emitter of bipolar transistor 36 senses the voltage on node 28, and transistor 40 impresses the same voltage across the drain of transistor 42 through the servo loop of transistor 40, current source 38, and transistor 44. Since transistor 42 has the same voltage at its drain as the drain on transistor 26 and both transistors have gates connected to voltage line 30, the two transistors must have the same drain current. Therefore, transistor 40 and transistor 44 must be supplying the same current through transistor 42 as transistor 24, current source 32, and transistor 36 are providing through transistor 26.

The bias currents 34 and 38 keep bipolar transistors 36 and 40 biased at the current, $I_{BIAS}$. Bias current source 32 provides a current of $3I_{BIAS}$ which is needed to compensate for the bias current $I_{BIAS}$ through transistor 44.

The circuit can be analyzed and the output currents determined by examining two cases: 1) $I_{BIAS}=0$ and $I_{LOAD}>0$ and 2) $I_{BIAS}>0$ and $I_{LOAD}=0$. The results can be superimposed, and the currents through transistors 44 and 46 can be found to be approximately $I_{BIAS}+I_{LOAD}/(2N+1)$. Transistor 46 provides its current as the first output of the current-sense circuit. An additional bias current source 48 of value $I_{BIAS}$ is provided as a second output to be used to cancel the current $I_{BIAS}$ in the first output current.

Figure 3:
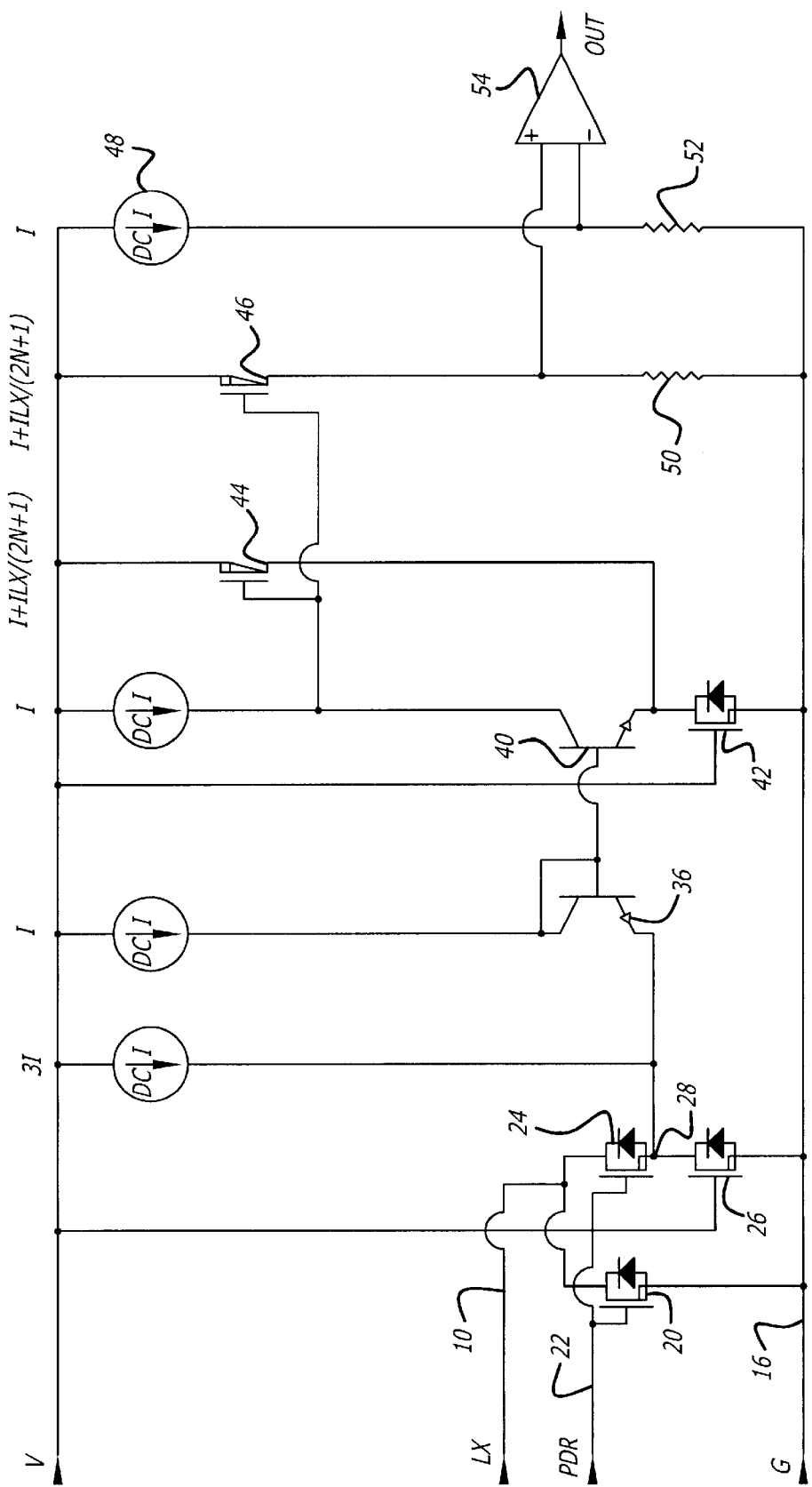
FIG. 3 is a modification of the circuit of FIG. 1 including a differential amplifier for providing a measure of the sensed current.

FIG. 3 is the circuit of FIG. 2 with resistor 50 connecting the current through transistor 46 to circuit ground and resistor 52 connecting the current from current source 48 to circuit ground. The two voltages across resistors 50, 52 can then be applied to a differential amplifier which effectively cancels out the bias current, $I_{BIAS}$, in the two lines and produces an output which is a scaled measure of the load current in line 10.

In practice, a huge displacement current can flow through switch 20 immediately after the switch is turned on. A huge displacement current can provide a false reading if it is allowed to appear at the output of the current-sense circuit.

Figure 4:
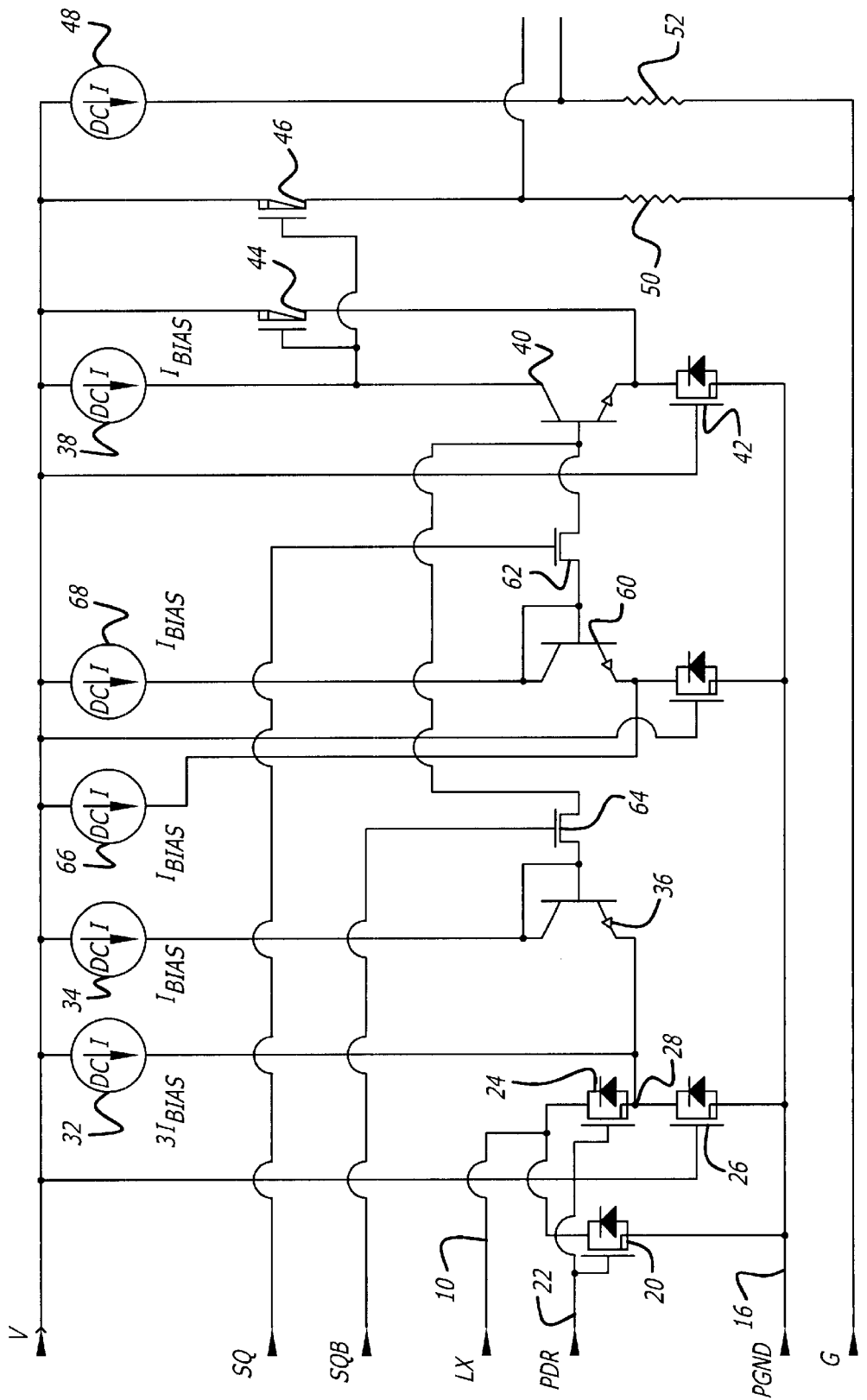
FIG. 4 is a modification of the circuit of FIG. 2 for avoiding spurious high currents upon closure of the power switch.

FIG. 4 shows a modification of the circuit of FIG. 2 which includes an isolation device 60 which is connected through a switch 62 to the base of transistor 40 and thus to the drain of transistor 42 immediately upon closing of switch 20. After a short period of time, for example 100 nanoseconds, switch 62 is opened and a switch 64 is closed to thereby connect transistor 36 to the base of transistor 40 as in FIG. 2. Switches 62, 64 are controlled by squelch signals SQ and SQbar so that switch 62 is closed momentarily only after the application of signal PDR on line 22 and the closure of switch 20. Thereafter, switch 62 is opened and switch 64 is closed. $I_{BIAS}$ current sources 66, 68 are connected to the emitter and collector, respectively, of transistor 60.

Current-sense circuit in accordance with the invention provides for fast and precise sensing of a current through a high current switch while the sense circuitry is protected when a high-voltage appears across the switch and prevents false readings from transient large currents when the load switch is first closed. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A circuit for sensing load current comprising:
   a) a first conductive path for passing a first portion of load current,
   b) a second conductive path for passing a second portion of the load current and a scaled bias current, and
   c) an output circuit responsive to a generated voltage from the second portion of the load current and the scaled bias current in the second conductive path for producing a measure of the load current.

2. The circuit as defined by claim 1 wherein the first conductive path comprises a load current switch, and the second conductive path comprises a voltage divider.

3. The circuit as defined by claim 2 wherein the voltage divider comprises first and second serially connected field effect transistors having a common node.

4. The circuit as defined by claim 3 wherein the generated voltage in the second conductive path is taken at the common node, the output circuit including a third field effect transistor with the generated voltage applied across the third field effect transistor.

5. The circuit as defined by claim 4 wherein the second field effect transistor and the third field effect transistor have the same gate voltage applied thereto.

6. The circuit as defined by claim 5 wherein the output circuit includes fourth and fifth transistors including the fourth transistor for applying a current through the third field effect transistor and the fifth transistor providing an equal current as a first output.

7. The circuit as defined by claim 6 wherein the current from the fourth transistor is a sum of the bias current and a scaled value of the sensed current.

8. The circuit as defined by claim 7 and further including a current source for providing a scaled bias current as a second output.

9. The circuit as defined by claim 8 and further including means for subtracting the second output from the first output and providing the measure of the sensed current.

10. The circuit as defined by claim 9 wherein the means includes a differential amplifier having first and second inputs produced by the first and second outputs.

11. The circuit as defined by claim 4 wherein the generated voltage at the common node is passed through a first transistor switch to the third field effect transistor.

12. The circuit as defined by claim 11 and further including an isolation device and a second transistor switch connecting the isolation device to the third field effect transistor, the second transistor switch being closed momentarily after the current switch is closed and the first transistor switch being opened momentarily, whereby the third field effect transistor is isolated from any large displacement current when the load current switch is first closed.

13. The circuit as defined by claim 3 wherein the load current switch comprises a third field effect device, and wherein one end of the first and third field effect transistors is coupled to a power supply terminal and one end of the second and third field effect transistors is coupled to a load, the first field effect transistor being turned on during operation of the circuit, the second and third transistors being turned on and off during operation of the circuit.

14. The circuit as defined by claim 13 wherein the second and third field effect transistors, when on, are turned on by approximately the same gate voltage as is holding the first field effect transistor on.

15. The circuit as defined by claim 5 wherein the output circuit includes fourth and fifth transistors including the fourth transistor for applying a current through the third field effect transistor and the fifth transistor providing a proportional current as a first output.

16. A load current sensing circuit comprising:
   first, second and third transistors, each having first and second terminals and a control terminal, the current flow between the first and second terminals being responsive to the voltage between the control terminal and the first terminal;
   the first terminals of the first and third transistors being coupled to a power supply terminal, the second terminal of first transistor being coupled to the first terminal of the second transistor and defining a node, and the second terminal of the second and third transistors being coupled to a load line;
   the control terminal of the first transistor being coupled to a voltage to turn the first transistor on during operation of the circuit;
   the control terminals of the second and third transistors being coupled together to turn the second and third transistors on and off; and,
   current mirror circuitry mirroring the current through the first transistor to provide an output responsive to the current in the load line.

17. The load current sensing circuit of claim 16 wherein the first, second and third transistors are field effect transistors, the first terminal being a source, the second terminal being a drain and the control terminal being a gate.

18. The load current sensing circuit of claim 17 further comprised of bias current sources biasing the current mirror circuitry, the output current being responsive to the current and the bias current in the load line.

19. The load current sensing circuit of claim 18 further comprising a differential amplifier having inputs responsive to the output current and the bias current and providing an amplifier output responsive to the current in the load line.

20. The load current sensing circuit of claim 19 wherein the control terminals of the first, second and third transistors are coupled to the same voltage when all three transistors are turned on.

21. A method of sensing load current comprising:

providing first, second and third transistors, the third transistor being larger than the first and second transistors;

coupling the third transistor between a power supply terminal and a load line;

coupling the first and second transistors in series, the first transistor being coupled to the power supply terminal and the second transistor being coupled to a load line holding the first transistor on;

turning the second and third transistors on and off to turn current in the load line on and off; and, mirroring the current through the first transistor to a load current sense output circuit to provide a load current sense output responsive to the current in the load line.

22. The method of claim 21 wherein the second and third transistors are turned on and off in unison.

23. The method of claim 22 wherein the transistors are field effect transistors.

* * * * *